United States Patent
Natter et al.

(10) Patent No.: US 9,510,491 B2
(45) Date of Patent: Nov. 29, 2016

(54) ELECTROMAGNETIC SHIELD TERMINATION DEVICE

(71) Applicant: Lear Corporation, Southfield, MI (US)

(72) Inventors: Brantley Natter, Brighton, MI (US); Eric Descombes, Solihull (GB); Ehab Tarmoom, Allen Park, MI (US)

(73) Assignee: Lear Corporation, Southfield, MI (US)

( * ) Notice: Subject to any disclaimer, the term of this patent is extended or adjusted under 35 U.S.C. 154(b) by 67 days.

(21) Appl. No.: 14/543,968

(22) Filed: Nov. 18, 2014

(65) Prior Publication Data

US 2015/0237771 A1    Aug. 20, 2015

Related U.S. Application Data

(60) Provisional application No. 61/940,604, filed on Feb. 17, 2014.

(51) Int. Cl.
| | |
|---|---|
| H01R 9/05 | (2006.01) |
| H05K 9/00 | (2006.01) |
| H02G 15/02 | (2006.01) |
| H02G 15/04 | (2006.01) |

(52) U.S. Cl.
CPC .......... *H05K 9/0098* (2013.01); *H02G 15/025* (2013.01); *H02G 15/046* (2013.01)

(58) Field of Classification Search
USPC ... 174/74 R, 75 C, 76, 77 R, 84 R, 85, 88 R, 174/88 C, 93
See application file for complete search history.

(56) References Cited

U.S. PATENT DOCUMENTS

| | | | | |
|---|---|---|---|---|
| 1,718,817 A | * | 6/1929 | Greene ................ | H02G 15/013 174/21 C |
| 3,280,246 A | * | 10/1966 | Lawson ................ | H01R 9/038 174/78 |
| 3,281,756 A | * | 10/1966 | O'Keefe .............. | H01R 13/502 174/88 C |
| 3,413,407 A | * | 11/1968 | Potter .................. | H02G 15/085 174/77 R |
| 3,439,294 A | * | 4/1969 | Flanagan ............. | H01R 9/0518 174/75 C |
| 4,804,338 A | * | 2/1989 | Dibble .................... | H01R 4/72 29/859 |
| 4,854,891 A | * | 8/1989 | Kamei ............... | H01R 13/6592 439/462 |
| 5,267,878 A | * | 12/1993 | Shinji .................... | H01R 9/032 439/607.5 |
| 6,039,604 A | * | 3/2000 | Tindall .................. | H01R 24/86 439/598 |
| 6,276,967 B1 | | 8/2001 | Hall | |
| 6,955,565 B2 | | 10/2005 | Lloyd et al. | |
| 7,255,602 B1 | | 8/2007 | Driessen et al. | |
| 7,494,348 B1 | | 2/2009 | Tyler et al. | |
| 7,632,147 B2 | | 12/2009 | Farahani et al. | |
| 7,731,536 B2 | | 6/2010 | Okayasu | |
| 7,753,726 B2 | | 7/2010 | Malstrom et al. | |

(Continued)

*Primary Examiner* — William H Mayo, III
(74) *Attorney, Agent, or Firm* — MacMillan, Sobanski & Todd, LLC

(57) ABSTRACT

An electromagnetic shield termination assembly includes a wire assembly having an electrically conductive wire. An electromagnetic shield extends coaxially with the electrically conductive wire and covers at least a portion of a circumference of the electrically conductive wire, the electromagnetic shield and the electrically conductive wire covered thereby defining a shielded portion of the wire assembly. A non-shielded portion of the wire assembly extends outward of a terminal end of the electromagnetic shield. A termination device has an electrically conductive housing mounted to the wire assembly about the terminal end of the electromagnetic shield such that a portion of the housing engages a portion of the electromagnetic shield, and wherein the housing provides a flow path for an electrical current flowing in the electromagnetic shield.

18 Claims, 12 Drawing Sheets

(56) References Cited

U.S. PATENT DOCUMENTS

| | | |
|---|---|---|
| 7,781,685 B2 * | 8/2010 | Bartholoma ....... H01R 13/5205 16/2.1 |
| 7,976,341 B2 | 7/2011 | Osenberg |
| 8,113,876 B1 | 2/2012 | Rossman et al. |
| 8,187,033 B2 | 5/2012 | Feldman et al. |
| 8,277,249 B2 | 10/2012 | Koga |
| 8,425,240 B2 | 4/2013 | Lee et al. |
| 8,525,034 B2 | 9/2013 | Roath et al. |
| 8,597,053 B2 | 12/2013 | Oh |

* cited by examiner

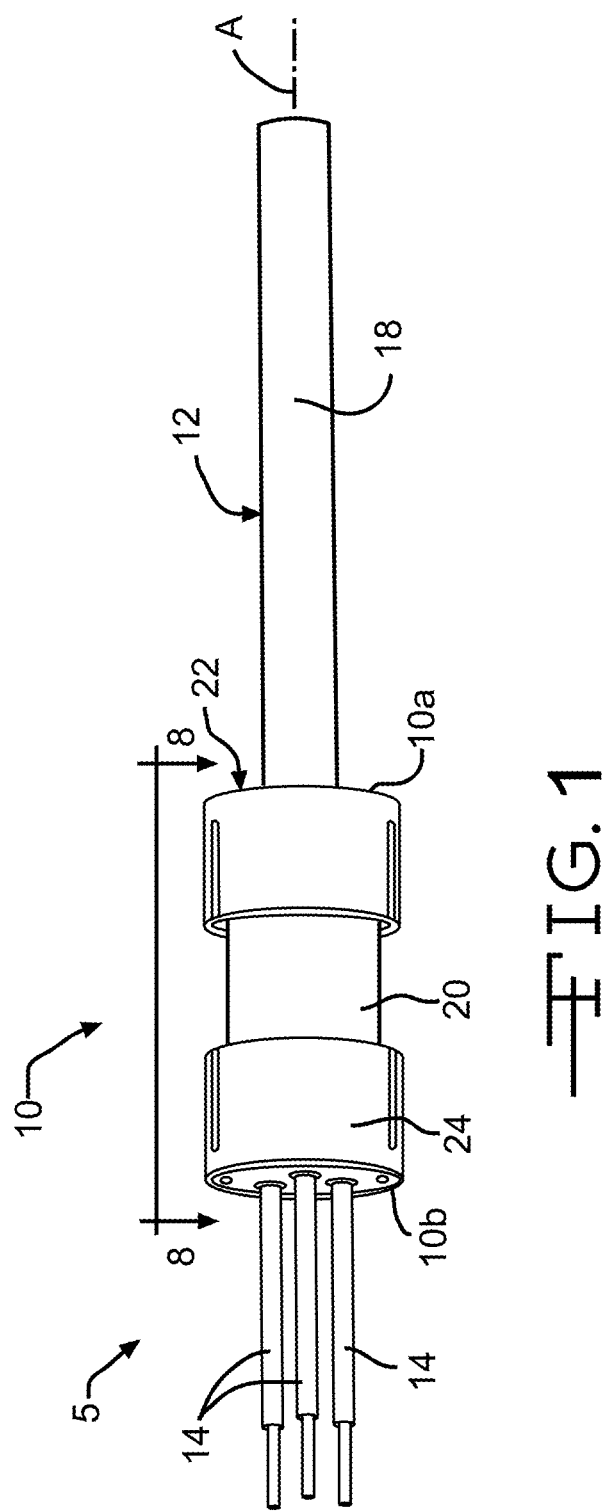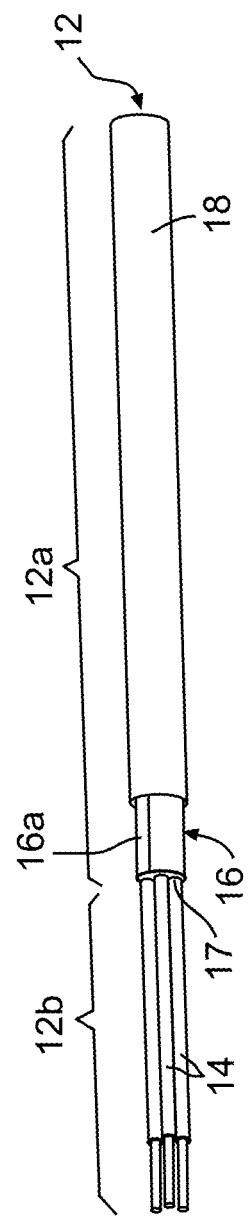
FIG. 1
FIG. 2

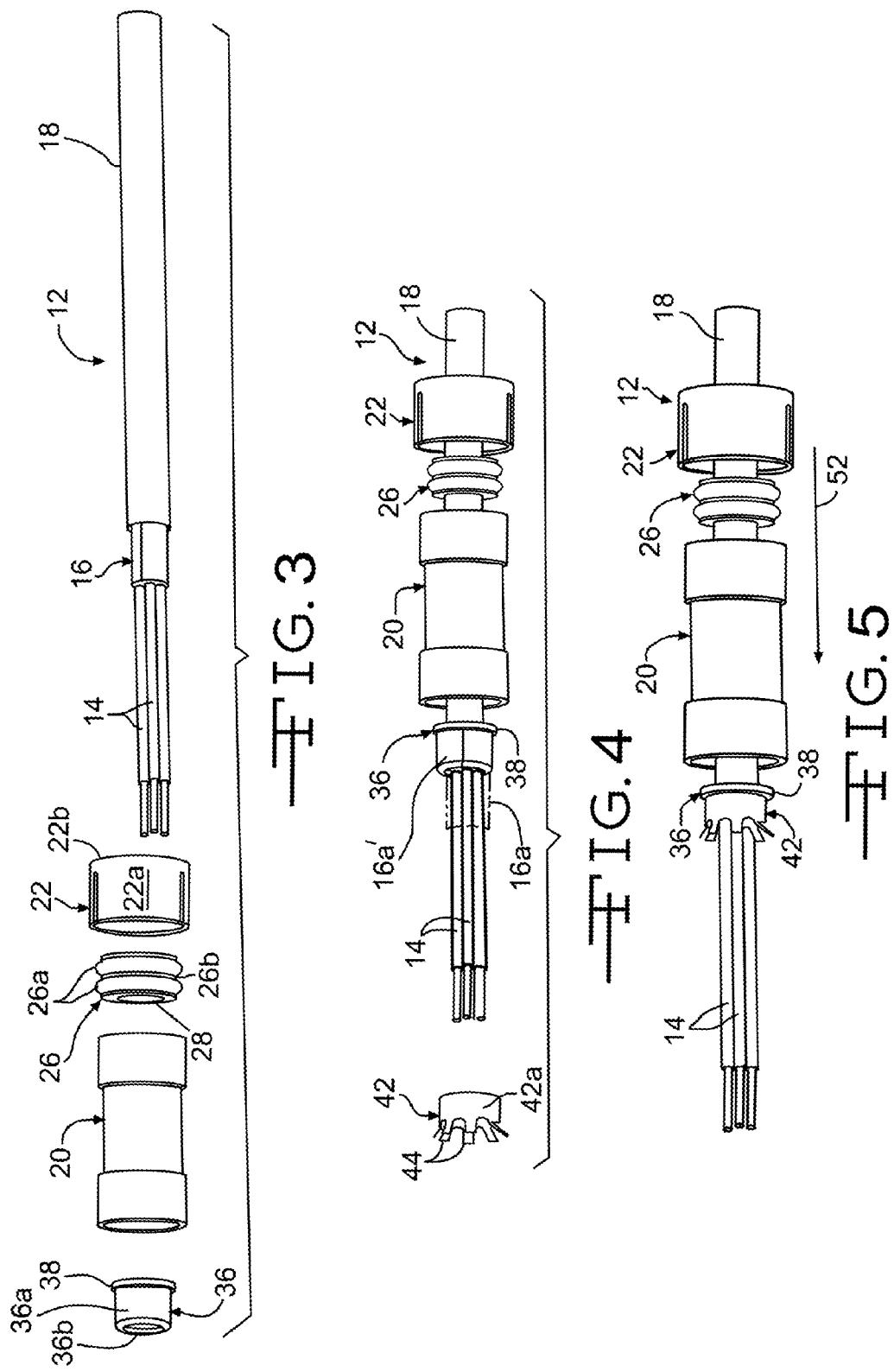

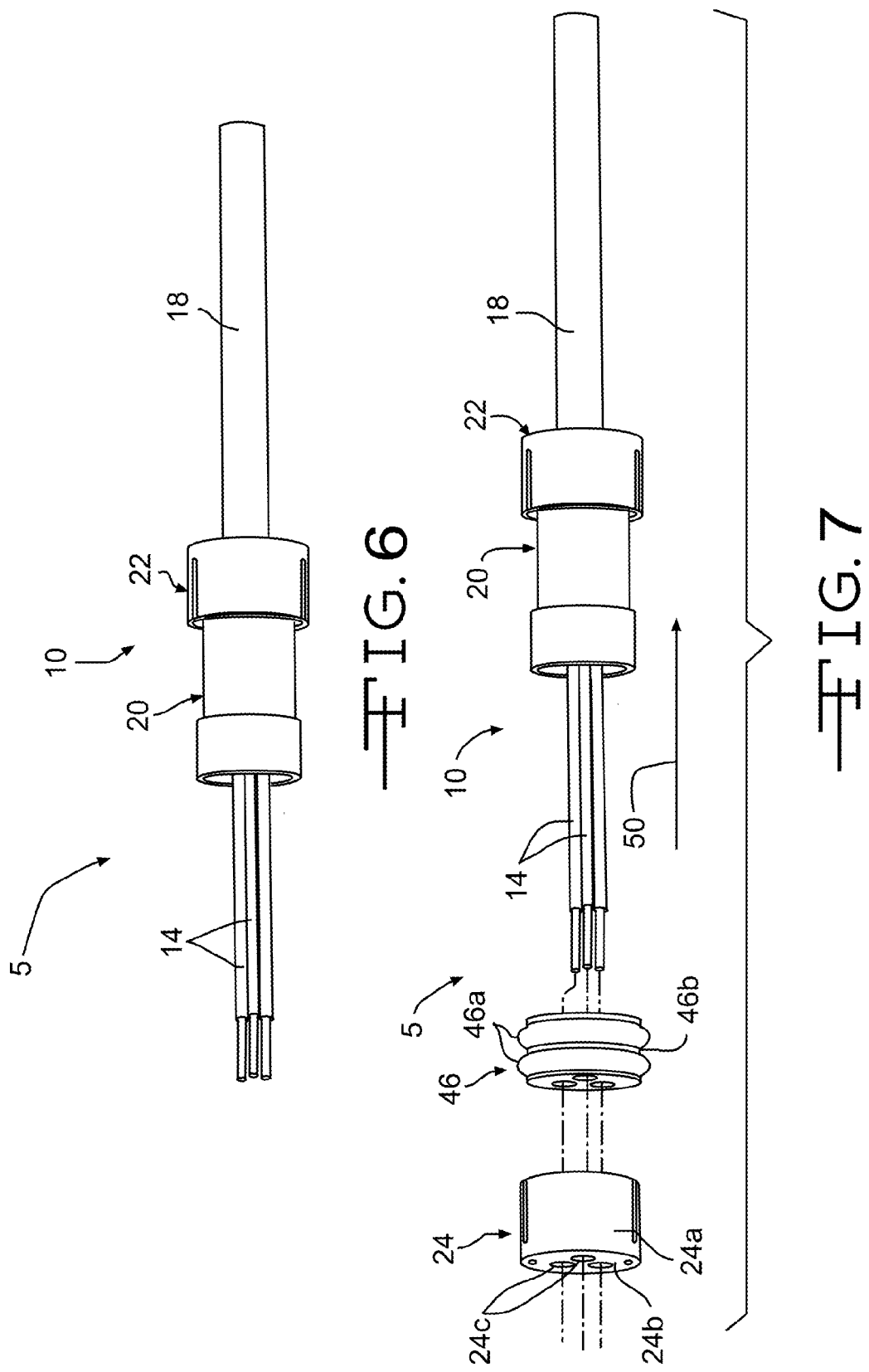

ELECTROMAGNETIC SHIELD TERMINATION DEVICE

CROSS REFERENCE TO RELATED APPLICATIONS

This application claims the benefit of U.S. Provisional Application No. 61/940,604 filed Feb. 17, 2014, the disclosure of which is incorporated herein by reference.

BACKGROUND OF THE INVENTION

This invention relates in general to a device for terminating an electromagnetic shield on a wire. In particular, this invention relates to an improved structure for such a device that terminates an electromagnetic shield between terminal ends of shielded single and multi-core wire assemblies, and at a point where a shielded portion of the wire assembly transitions to a non-shielded portion of the wire assembly.

With the proliferation in use of electronics and electronic equipment, it has become increasingly important to protect sensitive electronic equipment from the negative effects of electromagnetic interference (EMI). One way to protect electronic equipment is to provide an electromagnetic shield over wires that are connected to the equipment.

The electromagnetic shield attenuates magnetic fields generated by the current in the wires, reducing the potential interference with nearby electric components. This may be particularly important in an environment in which there are many electric components located relatively close to each other and where electromagnetic compatibility (EMC) is important. The electromagnetic shield offers flexibility in packaging high voltage electronics in an electrical system, such as in a vehicle, and reduces susceptibility to the electromagnetic fields emitted by the shielded wire of sensitive electronic components that are in close proximity to the shielded wire.

A conventional electromagnetic shield may be constructed from several small gauge wires braided over the internal signal and/or power wires for which shielding is desired, or may be an outer layer of metal that is coaxially arranged with a conductive wire. The electromagnetic shield absorbs radiated energy and distributes the energy away from the internal conductors and their connected electronic component. The wires or metal layer forming the shield are typically terminated and grounded, such as at one or more connector interfaces in the electrical system.

One common method of terminating and grounding such electromagnetic shields is a backshell assembly with a compression ring, but such backshell assemblies are difficult and time-consuming to assemble and disassemble. Conventional backshell assemblies are typically embodied as connectors attached to a terminal end of one or more electromagnetically shielded wires and which allow the one or more electromagnetically shielded wires to be grounded and connected to another electronic device. In such conventional electromagnetic termination connectors, environmental protection, i.e., sealing to prevent corrosion and contamination, is provided by the connector. Also, conventional electromagnetic termination connectors do not allow for interruption or termination of electrical wiring systems between devices in locations where an electromagnetic shield is not necessary, i.e., where EMI is not present, and therefore where EMC is not required.

It would therefore be desirable to provide an improved structure for a device that terminates an electromagnetic shield on shielded single and multi-core wire assemblies without need for a connector.

SUMMARY OF THE INVENTION

This invention relates to an improved structure for an electromagnetic shield termination assembly that includes a wire assembly having an electrically conductive wire. An electromagnetic shield extends coaxially with the electrically conductive wire and covers at least a portion of a circumference of the electrically conductive wire, the electromagnetic shield and the electrically conductive wire covered thereby defining a shielded portion of the wire assembly. A non-shielded portion of the wire assembly extends outward of a terminal end of the electromagnetic shield. A termination device has an electrically conductive housing mounted to the wire assembly about the terminal end of the electromagnetic shield such that a portion of the housing engages a portion of the electromagnetic shield, and wherein the housing provides a flow path for an electrical current flowing in the electromagnetic shield.

Other advantages of the invention will become apparent to those skilled in the art from the following detailed description, when read in view of the accompanying drawings.

BRIEF DESCRIPTION OF THE DRAWINGS

FIG. 1 is a perspective view of a first embodiment of an improved termination device according to the invention shown assembled on a multi-core wire assembly.

FIG. 2 is a perspective view showing a first step of a method of assembling the improved termination device to the multi-core wire assembly illustrated in FIG. 1.

FIG. 3 is an exploded perspective view of a portion of the termination device illustrated in FIG. 1 and showing a second step of a method of assembling the improved termination device to the multi-core wire assembly.

FIG. 4 is an exploded perspective view of a portion of the termination device illustrated in FIG. 1 and showing a third step of a method of assembling the improved termination device to the multi-core wire assembly.

FIG. 5 is an exploded perspective view of the portion of the termination device illustrated in FIG. 4 and showing a fourth step of a method of assembling the improved termination device to the multi-core wire assembly.

FIG. 6 is a perspective view of the portion of the termination device illustrated in FIGS. 4 and 5 and showing a fifth step of a method of assembling the improved termination device to the multi-core wire assembly.

FIG. 7 is an exploded perspective view of the termination device illustrated in FIG. 1 and showing a sixth step of a method of assembling the improved termination device to the multi-core wire assembly.

DETAILED DESCRIPTION OF THE INVENTION

Figure 8:
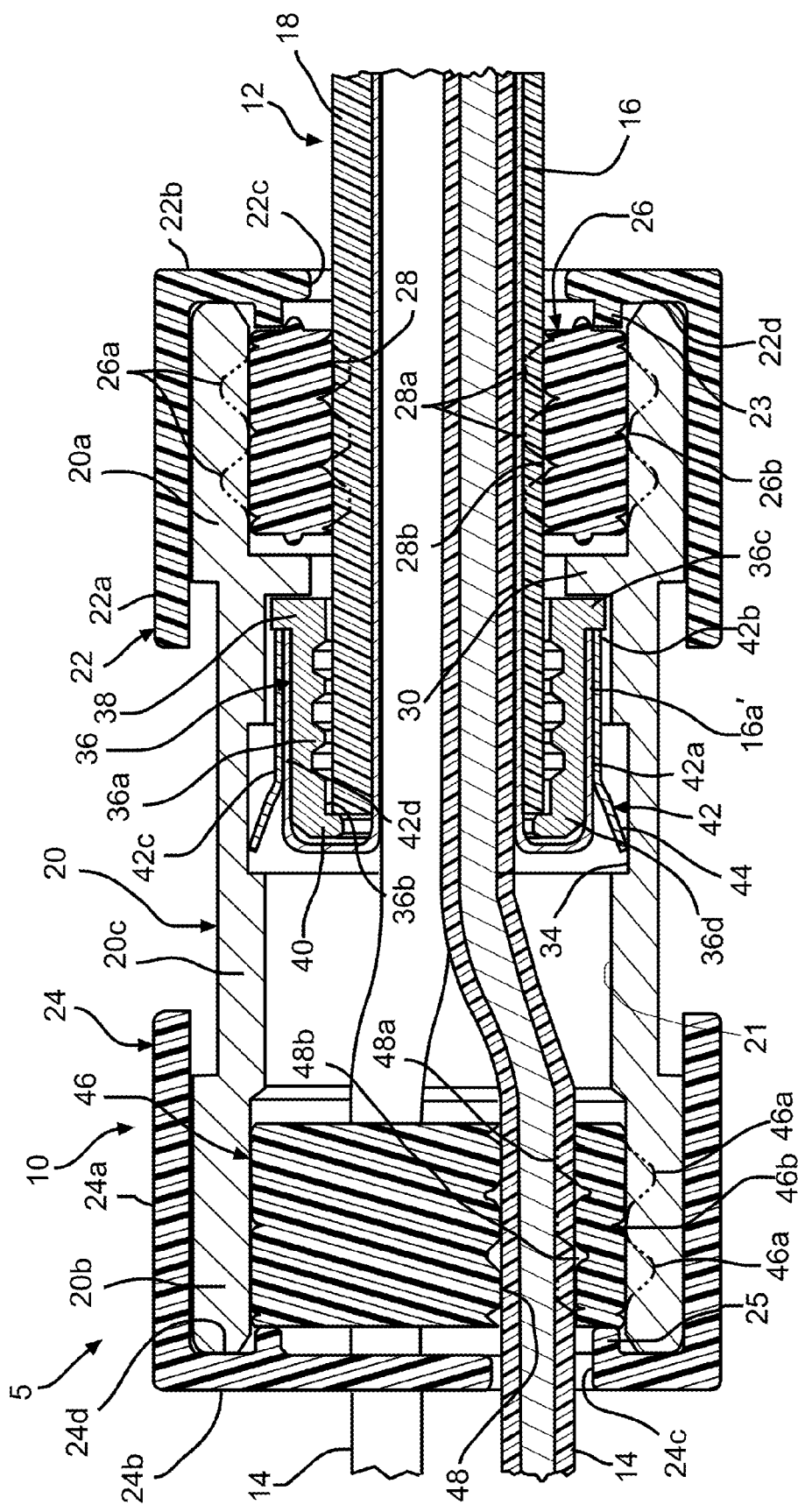
FIG. 8 is a cross sectional view of the improved termination device taken along the line 8-8 in FIG. 1.

The present invention will now be described with occasional reference to the specific embodiments of the invention. This invention may, however, be embodied in different forms and should not be construed as limited to the embodiments set forth herein. Rather, these embodiments are provided so that this disclosure will be thorough and complete, and will fully convey the scope of the invention to those skilled in the art.

Referring now to the drawings, FIGS. 1 through 9 illustrate portions of a first embodiment of an electromagnetic shield termination assembly 5 having an improved termination device 10 for an electromagnetic shield. In FIG. 1, the improved termination device 10 is shown assembled on a multi-core wire assembly 12. The structure and function of both the termination device 10 and the multi-core wire assembly 12 will be described in detail below.

The multi-core wire assembly 12, best shown in FIG. 2, is conventional in the art and includes a plurality of insulated electrically conductive wires 14 defining a wire axis A. The illustrated multi-core wire assembly 12 includes three insulated electrically conductive wires 14. Alternatively, the multi-core wire assembly 12 may include any desired number of insulated electrically conductive wires 14. As described in detail below, the improved termination device 10 may also be adapted for use with a single-core wire assembly.

As best shown in FIG. 2, the multi-core wire assembly 12 includes a first, shielded portion 12a having an axially extending electromagnetic wire shield 16 circumferentially surrounding the wires 14. The shield 16 may be comprised of braided strands of copper. The shield 16 may be comprised of a non-braided spiral winding of copper tape, a layer of copper foil, or a layer of electrically conductive polymer. Alternatively, the shield 16 may be formed from other electrically conductive metal. The function of the shield 16 is to absorb radiated energy and to distribute the energy to an electrical ground, thereby reducing electromagnetic radiation that may interfere with other devices. The shield 16 also acts to reduce the negative effects of electrical noise on the shielded wire assembly 12.

In the illustrated embodiment, the electromagnetic wire shield 16 is enclosed by an axially extending outer protective layer 18 circumferentially surrounding the wire shield 16. The outer protective layer 18 may be formed from polyvinyl chloride. Alternatively, the outer protective layer 18 may be formed from other material having desired electrical insulation, corrosion, and/or abrasion protection properties, such as for example other polymers. As shown in FIG. 2, an exposed portion 16a of the wire shield 16 extends outwardly of the outer protective layer 18 for a purpose described in detail below.

Desired lengths of the individual electrically conductive wires 14 extend outward of a terminal end 17 of the exposed portion 16a of the wire shield 16 and define a non-shielded portion 12b of the multi-core wire assembly 12.

Referring again to FIG. 1, the termination device 10 is shown mounted to the multi-core wire assembly 12 about the exposed portion 16a of the wire shield 16 and is provided to terminate the electromagnetic wire shield 16. The termination device 10 has first end 10a (to the right when viewing FIG. 1) and a second end 10b opposite the first end 10a, and includes a housing 20. A first seal retainer 22 is mounted to the housing 20 at the first end 10a of the termination device 10, and a second seal retainer 24 (see FIG. 7) is mounted to the housing 20 at the second end 10b of the termination device 10.

Figure 10:
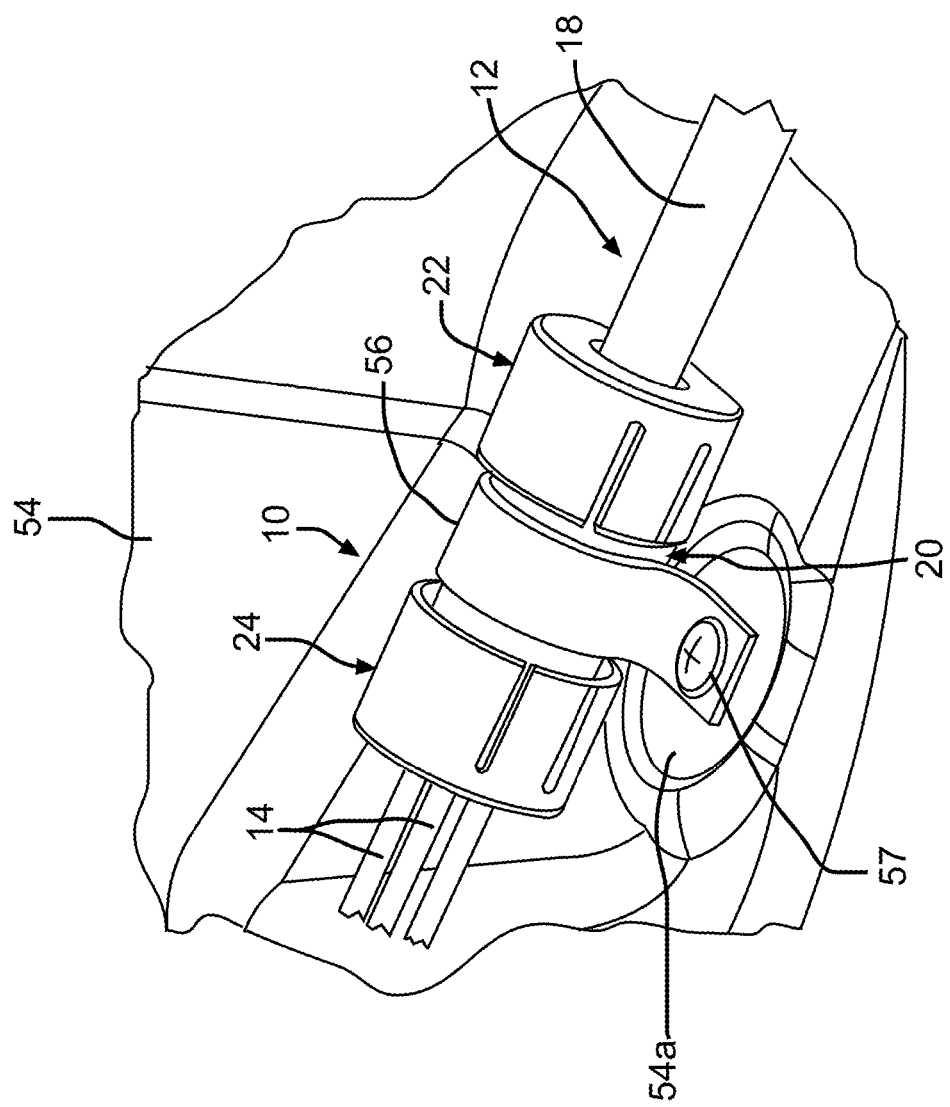
FIG. 10 is a perspective view of the improved termination device illustrated in FIGS. 1 through 9, shown with a first embodiment of a ground strap.

The improved termination device 10 allows the shielded portion 12a of the multi-core wire assembly 12 to be easily terminated at the terminal end 17 of the wire shield 16 and subsequently grounded to another device, such as a vehicle 54, a portion of which is shown in FIG. 10. The improved termination device 10 further allows the non-shielded portion 12b of the multi-core wire assembly 12 to continue outwardly of the termination device 10 to a desired location in an electrical system without the need for a connector.

Referring now to FIGS. 3 through 9, the components of the termination device 10 will now be described generally in the order in which they will be assembled onto the multi-core wire assembly 12 to form the improved termination device 10.

As shown in FIGS. 3 and 8, the first seal retainer 22 is substantially cup-shaped having a cylindrical side wall 22a and an end wall 22b having a wire aperture 22c formed therethrough. A circumferentially extending interior wall 23 (see FIG. 8) is formed between the side wall 22a and the wire aperture 22c in an inside surface of the end wall 22b and defines a circumferentially extending groove 22d. In the illustrated embodiment, the first seal retainer 22 is formed from nylon. Alternatively, the first seal retainer 22 may be formed from other non-conductive material having desired rigidity and burn resistance properties, such as for example other polymers.

As also shown in FIGS. 3 and 8, a first wire seal 26 has a generally cylindrical shape having an axially extending passage 28 therethrough. Circumferentially extending ridges 26a are formed in an outside surface of the first wire seal 26 and define a groove 26b therebetween. Additional circumferentially extending ridges 28a are formed on a surface of the passage 28 and define grooves 28b therebetween. In the illustrated embodiment, the first wire seal 26 is formed from silicon and defines a first resilient wire seal. Alternatively, the first wire seal 26 may be formed from other resilient and non-conductive material such as rubber, neoprene, flexible urethane, and other elastomers.

Figure 9:
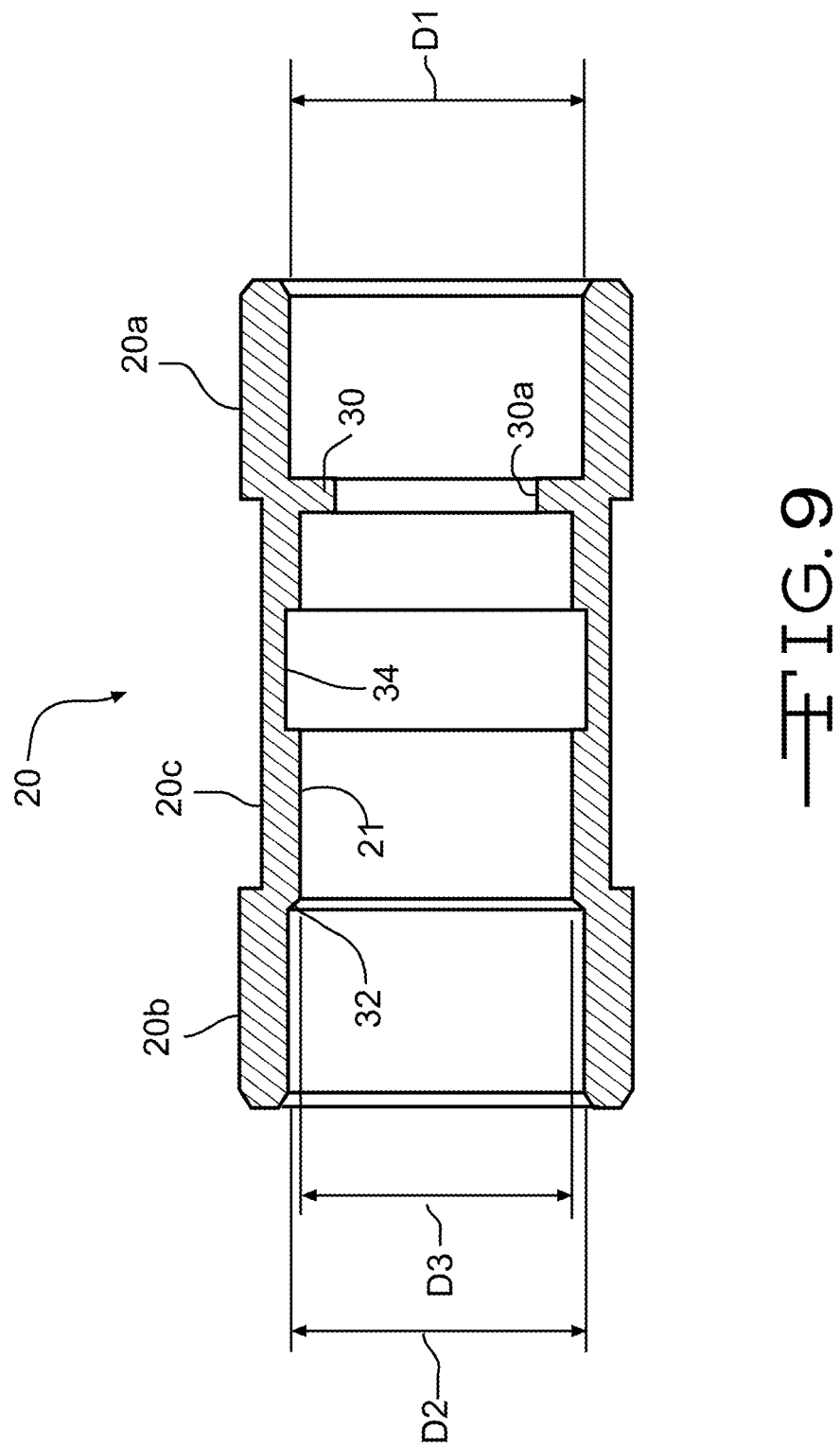
FIG. 9 is a cross sectional view of the housing illustrated in FIG. 8.

As best shown in FIG. 9, the housing 20 is substantially cylindrical and includes a first end portion 20a having a first internal diameter D1, a second end portion 20b having a second internal diameter D2, and a central portion 20c having a third internal diameter D3 defining an axially extending passage 21. A flange 30 extends radially inwardly from an inside surface of the housing 20 between the first end portion 20a and the central portion 20c and defines a wire aperture 30a. The second internal diameter D2 is slightly larger than the third internal diameter D3, and a circumferentially extending tapered shoulder 32 is formed in the inside surface of the housing 20 between the second end portion 20b and the central portion 20c. A circumferentially extending groove 34 is formed in an inside surface of the central portion 20c. In the illustrated embodiment, the housing 20 is formed from nickel-plated brass. Alternatively, the housing 20 may be formed from other electrically conductive metals such as nickel plated bronze, other nickel plated copper alloys, and other desired conductive materials.

Referring to FIGS. 3 and 8, a first or inner ferrule 36 defines a first electrically conductive member and has a cylindrical body 36a having an axially extending passage 36b therethrough. A first flange 38 extends circumferentially and radially outwardly from a first end 36c of the inner ferrule 36. A second flange 40 extends circumferentially and radially inwardly from a second end 36d of the inner ferrule 36.

Referring to FIGS. 4 and 8, a second or outer ferrule 42 defines a second electrically conductive member and has a cylindrical body 42a having a first end 42b, a second end 42c, and an axially extending passage 42d therethrough. A plurality of engaging arms 44 extend axially and radially outwardly of the second end 42c, the purpose for which will be described below.

In the illustrated embodiment, both the inner ferrule 36 and the outer ferrule 42 are formed from nickel plated brass. Alternatively, the inner ferrule 36 and the outer ferrule 42 may be formed from other electrically conductive metal such as nickel plated bronze, other nickel plated copper alloys, and other desired conductive material.

Referring to FIGS. 7 and 8, a second wire seal 46 has a generally cylindrical shape and three axially extending passages 48 therethrough. Circumferentially extending ridges 46a are formed in an outside surface of the seal 46 and define a groove 46b therebetween. Additional circumferentially extending ridges 48a are formed on a surface of each passage 48 and define grooves 48b therebetween. The second wire seal 46 is formed from silicon or any of the materials described above in reference to the first wire seal 26 and defines a second resilient wire seal.

As also shown in FIGS. 7 and 8, the second seal retainer 24 is similar to the first seal retainer 22 and is substantially cup-shaped, having a cylindrical side wall 24a and an end wall 24b. The end wall 24b has three wire apertures 24c formed therethrough. A circumferentially extending interior wall 25 is formed between the side wall 24a and the three wire apertures 24c on an inside surface of the end wall 24b and defines a circumferentially extending groove 24d. In the illustrated embodiment, the second seal retainer 24 is formed from nylon or any of the materials described above in reference to the first seal retainer 22.

Referring again to FIGS. 1 through 9, a method of assembling the improved termination device 10 to the multi-core wire assembly 12 will now be described. In a first step, the multi-core wire assembly 12 will be assembled as shown in FIG. 2 and described above.

In a second step, the multi-core wire assembly 12 is inserted through the wire aperture 22c of the first seal retainer 22, the passage 28 of the first wire seal 26, the passage 21 of the housing 20, and the passage 36b of the inner ferrule 36, as shown in FIGS. 3 and 8. The first seal retainer 22, the first wire seal 26, and the housing 20 may be temporarily positioned over the outer protective layer 18, i.e., to the right of the exposed portion 16a of the wire shield 16, as shown in FIG. 4. The inner ferrule 36 is positioned over the exposed portion 16a of the wire shield 16 until the second flange 40 engages a distal end (leftmost end when viewing FIG. 3) of the outer protective layer 18, as best shown in FIGS. 4 and 8.

In a third step of the method of assembling the termination device 10 to the multi-core wire assembly 12, the exposed portion of the wire shield 16 is folded over an outside surface of the ferrule body 36a, as shown at 16a' in FIGS. 4 and 8. The folding of the exposed portion 16a of the wire shield 16 may be accomplished with any suitable tool.

In a fourth step, the multi-core wire assembly 12 is next inserted through the passage 42d of the outer ferrule 42 until the first end 42b is seated against the first flange 38 of the inner ferrule 36, as shown in FIGS. 5 and 8. The body 42a of the outer ferrule 42 is crimped to the inner ferrule 36 and to the material of the exposed portion 16a' of the wire shield 16 that surrounds it to secure the outer ferrule 42 to the multi-core wire assembly 12.

In a fifth step of the method of assembling the termination device 10 to the multi-core wire assembly 12, the housing 20 is moved over the outer ferrule 42 in the direction of the arrow 52, as shown in FIG. 5, until the first flange 38 is seated against the flange 30 of the housing 20 and the engaging arms 44 are seated in the groove 34 of the housing 20, as shown in FIG. 8. The first wire seal 26 is then moved in the direction of the arrow 52 and into the first end portion 20a of the housing 20 between the flange 30 and the interior wall 23. The first seal retainer 22 is also moved in the direction of the arrow 52 and positioned about the first end portion 20a. The first seal retainer 22 is secured to the first end portion 20a in a snap fit arrangement such that the first end portion 20a is seated in the groove 22d of the first seal retainer 22, as shown in FIG. 8.

In a sixth step, each wire 14 of the multi-core wire assembly 12 is inserted through one of the passages 48 in the second wire seal 46 and through one of the wire apertures 24c in the second seal retainer 24, as shown in FIGS. 7 and 8. The second wire seal 46 is then moved in the direction of the arrow 50 and into the second end portion 20b of the housing 20 between the shoulder 32 and the interior wall 25. The second seal retainer 24 is also moved in the direction of the arrow 50 and positioned about the second end portion 20b. Like the first seal retainer 22, the second seal retainer 24 is secured to the second end portion 20b in a snap fit arrangement such that the second end portion 20b is seated in the groove 24d of the second seal retainer 24, as shown in FIG. 8.

In the illustrated embodiment of the termination device 10, the seals 26 and 46 respectively retain the shielded portion 12a and the non-shielded portion 12b of the multi-core wire assembly 12 in a desired position relative to the housing 20 of the termination device 10. Further, the seals 26 and 46 provide a water-tight seal between the interior of the housing 20 and the environment outside the housing 20 to prevent or reduce corrosion and contamination within the termination device 10. More specifically, the seals 26 and 46 provide a circumferential seal between the shielded portion 12a and each wire 14 of the non-shield portion 12b of the multi-core wire assembly 12, respectively, and the housing 20.

In the illustrated embodiment, the termination device 10 advantageously creates a flow path for the external current flowing through the wire shield 16. The external current can flow through the folded portion 16a' of the wire shield 16, the body 42a and the engaging arms 44 of the outer ferrule 42, and the housing 20. Accordingly, the termination device 10 may then be grounded to another device, such as a metallic portion 54a of a vehicle 54, only a portion of which is shown in FIG. 10.

In the embodiment illustrated in FIG. 10, a first embodiment of a ground strap is shown at 56. In the exemplary embodiment illustrated, the ground strap 56 is a metal clamp attached to the housing 20 and further attached to the metallic portion 54a of the vehicle 54 with a fastener 57, such as a threaded fastener. Alternatively, the metal clamp 56 may be attached to the metallic portion 54a of the vehicle 54 by any desired means, such as by welding. The metal clamp 56 provides an electrically conductive path between the housing 20 of the termination device 10 and the ground, i.e., the metallic portion 54a of the vehicle 54.

Figure 11:
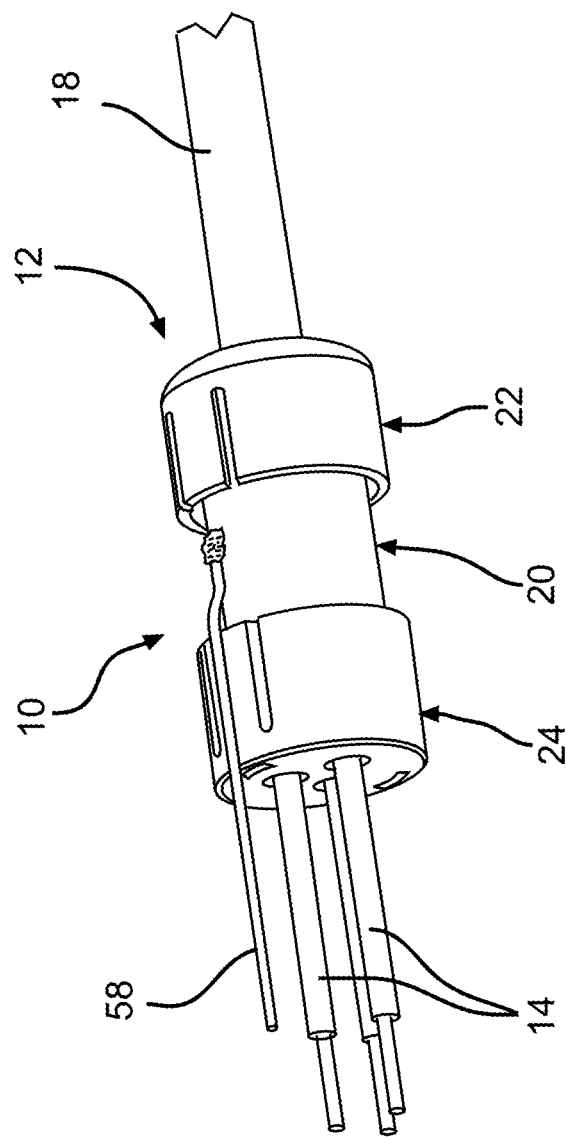
FIG. 11 is a perspective view of the improved termination device illustrated in FIGS. 1 through 9, shown with a second embodiment of a ground strap.

A second embodiment of a ground strap is shown at 58 in FIG. 11. In the exemplary embodiment illustrated in FIG. 11, the ground strap 58 is an electrically conductive wire that is electrically connected to the housing 20, such as by welding, and further attached to the metallic portion 54a of the vehicle 54, such as shown in FIG. 10. Like the clamp 56, the wire 58 may be attached to any suitable ground location in the vehicle 54 by any desired means, such as with a fastener (not shown), a conventional electrical wire connector (not shown), or by welding. Alternatively, the wire 58 may be attached to any desired metallic portion of the vehicle 54. The wire 58 acts to reduce undesirable electrical noise via the ground to which it is attached.

Figure 12:
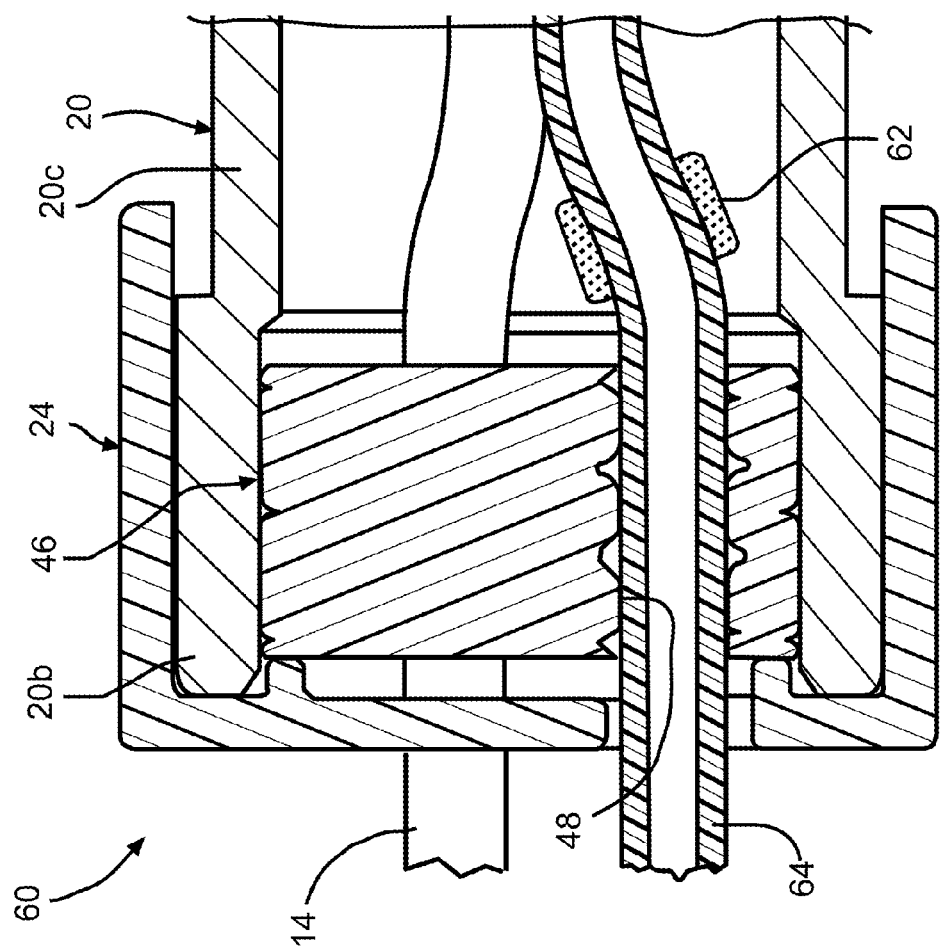
FIG. 12 is a cross sectional view of a portion of a second embodiment of the improved termination device illustrated in FIG. 1.

A second embodiment of the termination device is shown at 60 in FIG. 12. The termination device 60 is identical to the termination device 10, but includes a ferrite bead 62 on a ground wire 64 of the plurality of electrically conductive wires 14. The ferrite bead 62 is formed from ferrite ceramic and provides passive suppression of high frequency noise in electronic circuits in a conventional manner.

Figure 13:
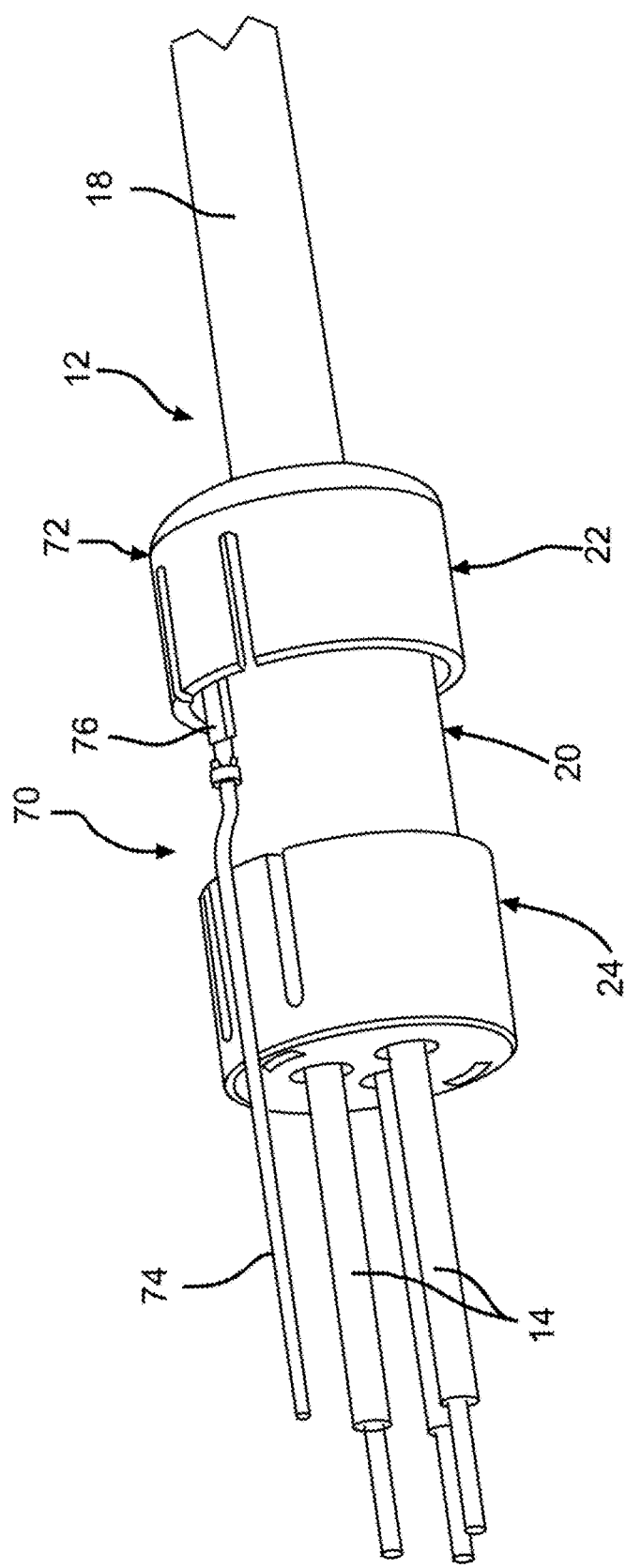
FIG. 13 is a perspective view of a third embodiment of the improved termination device illustrated in FIG. 1.

A third embodiment of the termination device is shown at 70 in FIG. 13. The termination device 70 is similar to the termination device 10, but includes an electrically conductive first seal retainer 72 in lieu of the first seal retainer 22. An electrically conductive wire 74 is electrically connected to the retainer 72 and to the metallic portion 54a of the vehicle 54 by any desired means, such as with a conventional electrical wire connector 76, a fastener (not shown), or by welding. As described above and shown in FIG. 8, the external current can flow through the folded portion 16a' of the wire shield 16, the body 42a and the engaging arms 44 of the outer ferrule 42, and the housing 20. The electrically conductive first seal retainer 72 then allows the external current to additionally flow from the housing 20 through the retainer 72 and the wire 74 to a ground, such as the metallic portion 54a of the vehicle 54, shown in FIG. 10. Alternatively, the wire 74 may be attached to any desired metallic portion of the vehicle 54. Like the wire 58, the wire 74 acts to reduce undesirable electrical noise via the ground to which it is attached.

Figure 14:
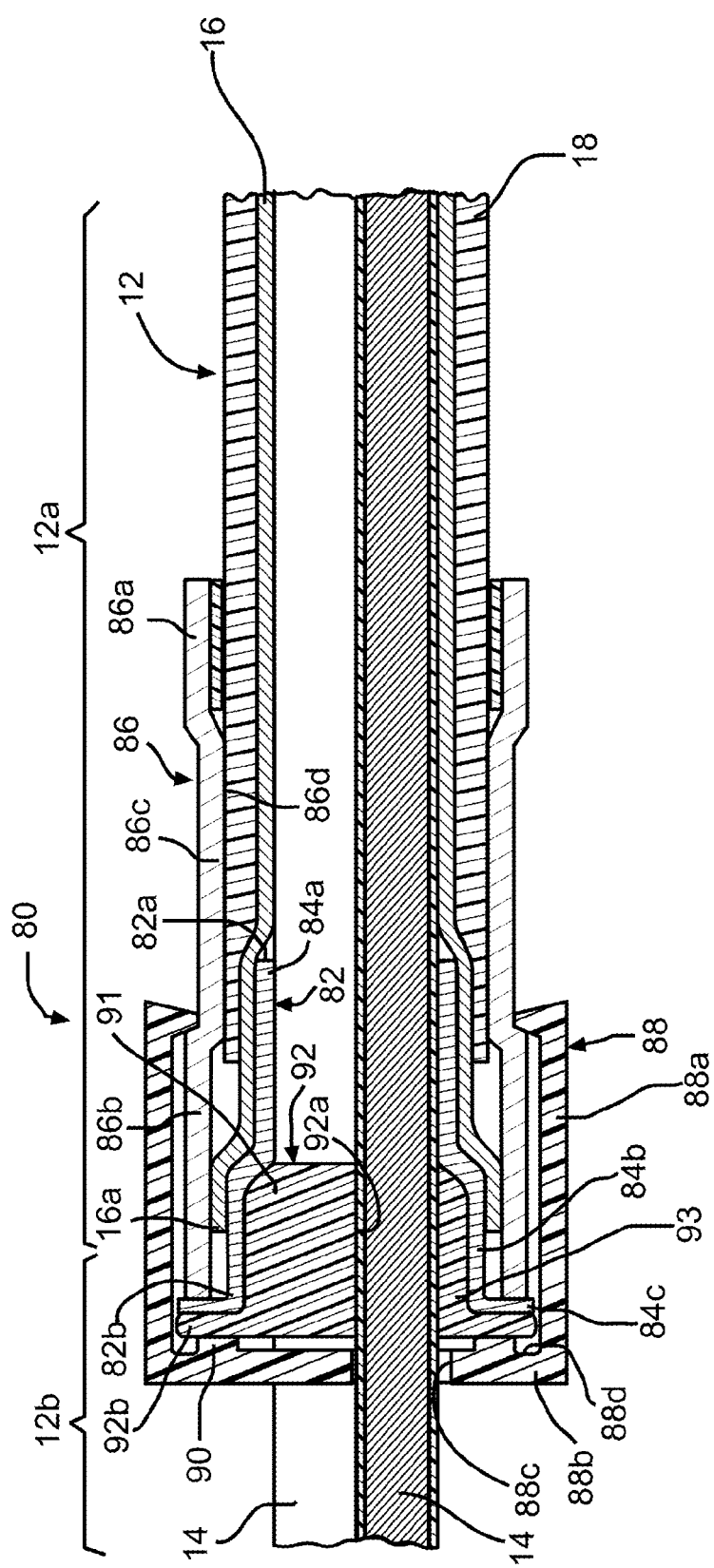
FIG. 14 is a cross sectional view of a fourth embodiment of the improved termination device illustrated in FIG. 1.

A fourth embodiment of the termination device is shown at 80 in FIG. 14. The improved termination device 80 is similar to the improved termination device 10 and is shown assembled on the multi-core wire assembly 12. The multi-core wire assembly 12, also shown in FIG. 2, includes a plurality of insulated electrically conductive wires 14, only two of which are shown. It will be understood that the improved termination device 80 may also be adapted for use with a single-core wire assembly.

The multi-core wire assembly 12 includes a first, shielded portion 12a having the axially extending electromagnetic wire shield 16 circumferentially surrounding the wires 14. In the illustrated embodiment, the electromagnetic wire shield 16 is enclosed by the axially extending outer protective layer 18 circumferentially surrounding the wire shield 16.

A ferrule 82 has a first end 82a, a second end 82b, a first cylindrical body portion 84a having a first diameter, and a second cylindrical body portion 84b having a second diameter larger than the first diameter. A flange 84c extends circumferentially and radially outwardly from the second end 82b.

A housing 86 is substantially cylindrical and includes a first end portion 86a having a first internal diameter, a second end portion 86b having a second internal diameter, and a central portion 86c having a third internal diameter defining an axially extending passage 86d. The first and second internal diameters are larger than the third internal diameter.

A seal retainer 88 is substantially cup-shaped having a cylindrical side wall 88a and an end wall 88b having a wire aperture 88c formed therethrough. A circumferentially extending interior wall 90 is formed between the side wall 88a and the wire aperture 88c in an inside surface of the end wall 88b and defines a circumferentially extending groove 88d.

A wire seal 92 has a generally cylindrical shape and three passages 92a extending axially therethrough between a first end 91 and a second end 93. A flange 92b extends circumferentially and radially outwardly from the second end 93. If desired, circumferentially extending ridges and grooves (not shown) may be formed in an outside surface of the wire seal 92 and on the inner surface of each passage 92a, similar to those shown in FIGS. 8 and 16.

In the illustrated embodiment, a first end 82a of the ferrule 82 is inserted between the wire shield 16 and the wires 14 of the multi-core wire assembly 12 at a distal end 16a of the wire shield 16. The wire shield 16 may be crimped to the ferrule 82 such that a portion of the wire shield 16 is secured to the second end portion 84b of the ferrule 82 and a portion of the wire shield 16 is secured to the first end portion 84a of the ferrule 82.

The flange 84c of the ferrule 82 is seated against the first end portion 86a of the housing. The seal retainer 88 is secured to the second end portion 86b in a snap fit arrangement. The wire seal 92 is seated in the second cylindrical body portion 84b of the ferrule 82 such that the wires 14 extend through the passages 92a and the flange 92b is between the flange 84c and the interior wall 90 of the seal retainer 88.

Figure 15:
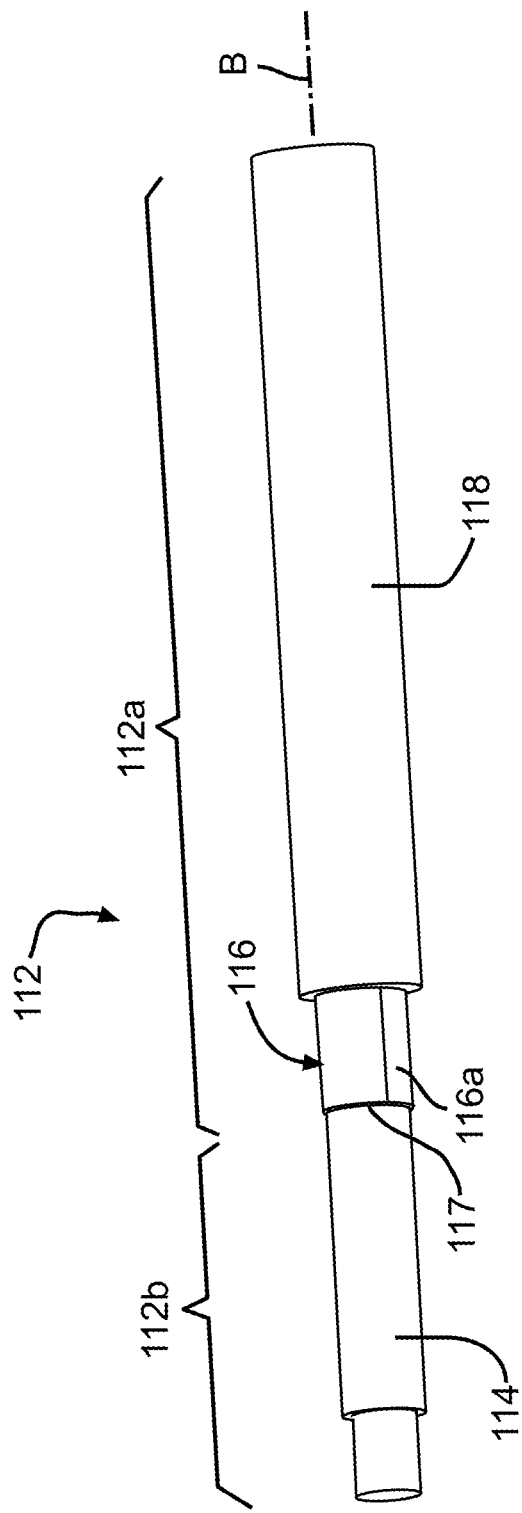
FIG. 15 is a perspective view of a single-core wire assembly for use with a fifth embodiment of the improved termination device.
Figure 16:
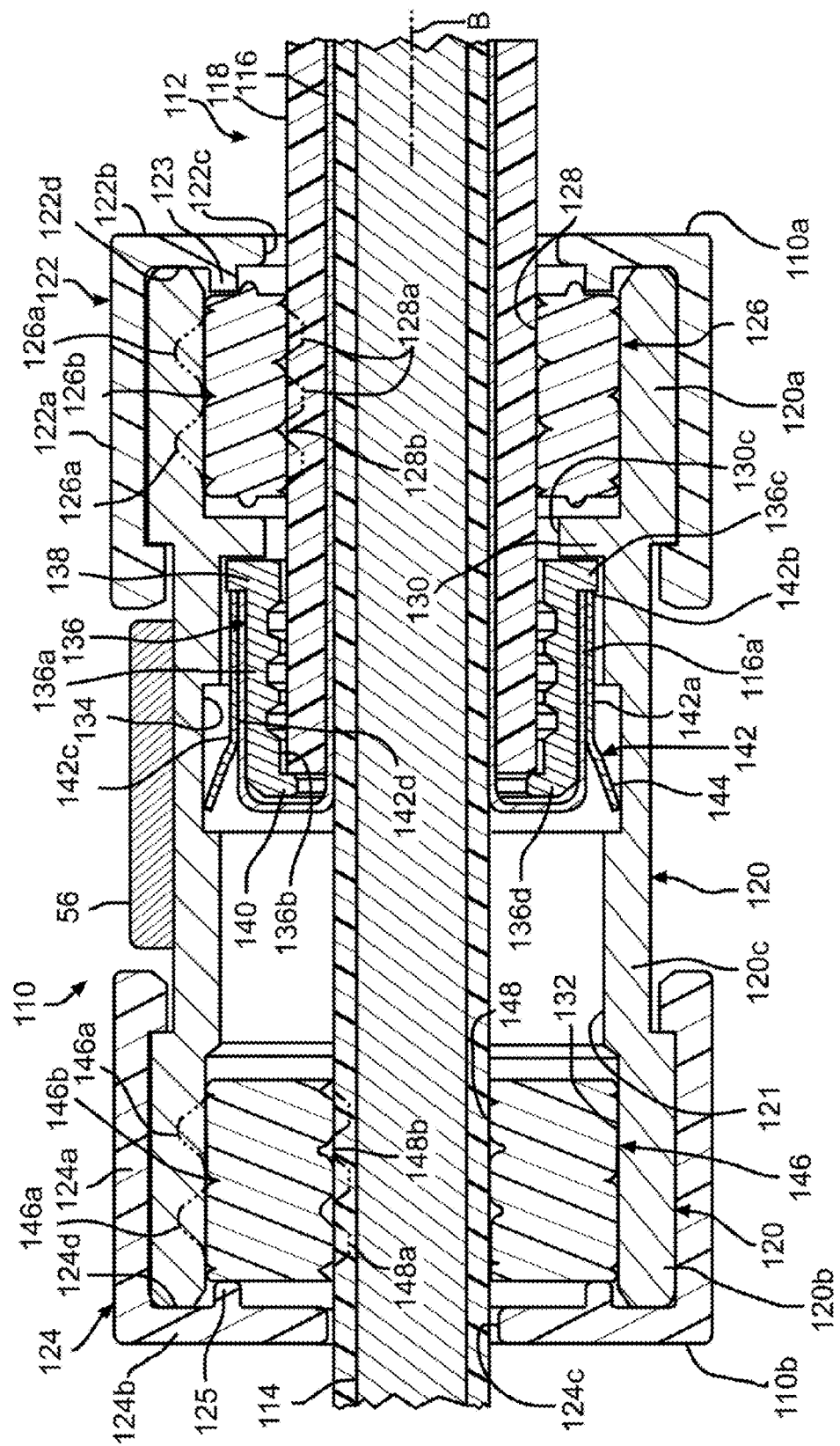
FIG. 16 is a cross sectional view of a fifth embodiment of the improved termination device shown assembled on the single-core wire assembly illustrated in FIG. 15.

A fifth embodiment of the improved termination device is shown at 110 in FIGS. 15 and 16. The improved termination device 110 is similar to the improved termination device 10 but is configured for use with a single-core wire assembly 112, as best shown in FIG. 15. Each component part of the improved termination device 110 may be formed from the same materials as the corresponding component part in the improved termination device 10.

The single-core wire assembly 112 is conventional in the art and includes an insulated electrically conductive wire 114 defining a wire axis B. The single-core wire assembly 112 includes a first, shielded portion 112a having an axially extending electromagnetic wire shield 116 circumferentially surrounding the wire 114.

In the illustrated embodiment, the electromagnetic wire shield 116 is enclosed by an axially extending outer protective layer 118 circumferentially surrounding the wire shield 116. As shown in FIG. 15, an exposed portion 116a of the wire shield 116 extends outward of the outer protective layer 118.

A desired length of the electrically conductive wire 114 extends outward of a terminal end 117 of the exposed portion 116a of the wire shield 116 and defines a non-shielded portion 112b of the single-core wire assembly 112.

As shown in FIG. 16, the termination device 110 is mounted to the single-core wire assembly 112 about the exposed portion 116a of the wire shield 116 and is provided to terminate the electromagnetic wire shield 116. The termination device 110 has first end 110a (to the right when viewing FIG. 16) and a second end 110b opposite the first end 110a, and includes a housing 120. First and second seal retainers 122 and 124 are mounted to the housing 120 at the first end 110a and at the second end 110b, respectively, of the termination device 110.

The first seal retainer 122 is substantially cup-shaped having a cylindrical side wall 122a and an end wall 122b having a wire aperture 122c formed therethrough. A circumferentially extending interior wall 123 is formed between the side wall 122a and the wire aperture 122c in an inside surface of the end wall 122b and defines a circumferentially extending groove 122d.

The second seal retainer 124 is also substantially cup-shaped having a cylindrical side wall 124a and an end wall 124b having a wire aperture 124c formed therethrough. A circumferentially extending interior wall 124 is formed between the side wall 124a and the wire aperture 124c in an inside surface of the end wall 124b and defines a circumferentially extending groove 124d.

A first wire seal 126 has a generally cylindrical shape having an axially extending passage 128 therethrough. Circumferentially extending ridges 126a are formed in an outside surface of the first wire seal 126 and define a groove 126b therebetween. Additional circumferentially extending ridges 128a are formed on a surface of the passage 128 and define grooves 128b therebetween.

A second wire seal 146 also has a generally cylindrical shape having an axially extending passage 148 therethrough. Circumferentially extending ridges 146a are formed in an outside surface of the second wire seal 146 and define a groove 146b therebetween. Additional circumferentially extending ridges 148a are formed on a surface of the passage 148 and define grooves 148b therebetween.

The housing 120 is substantially cylindrical and includes a first end portion 120a, a second end portion 20b, and a central portion 120c defining an axially extending passage 121. A flange 130 extends radially inward from an inside surface of the housing 120 between the first end portion 120a and the central portion 120c and defines a wire aperture 130a. A circumferentially extending tapered shoulder 132 is formed in the inside surface of the housing 120 between the second end portion 120b and the central portion 120c. A circumferentially extending groove 134 is formed in an inside surface of the central portion 120c.

A first or inner ferrule 136 has a cylindrical body 136a having an axially extending passage 136b therethrough. A first flange 138 extends circumferentially and radially outwardly from a first end 136c of the inner ferrule 136. A second flange 140 extends circumferentially and radially inwardly from a second end 136d of the inner ferrule 136.

A second or outer ferrule 142 has a cylindrical body 142a having a first end 142b, a second end 142c, and an axially extending passage 142d therethrough. A plurality of engaging arms 144 extend axially and radially outwardly of the second end 142c.

The inner ferrule 136 is positioned over the shielded portion 112a of the single-core wire assembly 112 such that the second flange 140 engages a distal end (leftmost end when viewing FIG. 16) of the outer protective layer 118. The exposed portion 116a' of the wire shield 116 is folded over an outside surface of the ferrule body 136a, and the outer ferrule 142 is disposed around the inner ferrule 136 such that the first end 142b is seated against the first flange 138 of the inner ferrule 136. The body 142a of the outer ferrule 142 is crimped to the inner ferrule 136 and to the material of the exposed portion 116a' of the wire shield 116 that surrounds it to secure the outer ferrule 142 to the single-core wire assembly 112.

As shown in FIG. 16, the housing 120 is positioned over the outer ferrule 142 such that the first flange 138 is seated against the flange 130 of the housing 120 and the engaging arms 144 are seated in the groove 134 of the housing 120. The first wire seal 126 is seated in the first end portion 120a of the housing 120 between the flange 130 and the interior wall 123. The first seal retainer 122 is secured to the first end portion 120a in a snap fit arrangement such that the first end portion 120a is seated in the groove 122d of the first seal retainer 122.

Similarly, the second wire seal 146 is seated in the second end portion 120b of the housing 120 between the shoulder 132 and the interior wall 125. The second seal retainer 124 is secured to the second end portion 120b in a snap fit arrangement such that the second end portion 120b is seated in the groove 124d of the second seal retainer 124.

In the illustrated embodiment of the termination device 110, the wire seals 126 and 146 retain the shielded portion 112a and the non-shield portion 112b of the single-core wire assembly 112 in a desired position relative to the housing 120 of the termination device 10. Further, the seals 126 and 146 provide a water-tight seal between the interior of the housing 120 and the environment outside the housing 120 to prevent or reduce corrosion and contamination within the termination device 110. More specifically, the first seal 126 provides a circumferential seal between the shielded portion 112a and the housing 120, and the second seal 146 provides a circumferential seal between the non-shielded portion 112b and the housing 120. Additionally, the illustrated embodiment of the termination device 110 may be grounded, such as to the metallic portion 54a of the vehicle 54 shown in FIG. 10, by a ground strap. For example, the termination device 110 may be grounded by the metal clamp 56 attached to the housing 120, as also shown in FIG. 10.

The principle and mode of operation of the invention have been described in its preferred embodiments. However, it should be noted that the invention described herein may be practiced otherwise than as specifically illustrated and described without departing from its scope.

What is claimed is:

1. An electromagnetic shield termination assembly comprising:
   a wire assembly having an electrically conductive wire and an electromagnetic shield covering a portion of the electrically conductive wire and thereby defining a shielded portion of the wire assembly, a non-shielded portion of the wire assembly extending outwardly of a terminal end of the electromagnetic shield;
   a termination device having an electrically conductive housing mounted to the wire assembly about the terminal end of the electromagnetic shield such that a portion of the housing engages a portion of the electromagnetic shield and thereby provides a flow path for an electrical current flowing in the electromagnetic shield; and either:
   (1) an electrically conductive ground strap attached to the housing and to an electrical ground; or
   (2) a passage formed in the housing through which the wire assembly extends, a first electrically conductive member mounted between the electromagnetic shield and a surface of the passage in the housing that defines a portion of the flow path for the electrical current flowing in the electromagnetic shield, and a second electrically conductive member mounted between the first electrically conductive member and the surface of the passage in the housing that defines a portion of the flow path for the electrical current flowing in the electromagnetic shield.

2. The electromagnetic shield termination assembly according to claim 1, wherein the shielded portion of the wire assembly extends outwardly of a first end of the housing, and the non-shielded portion of the wire assembly extends outwardly of a second end of the housing.

3. The electromagnetic shield termination assembly according to claim 1, wherein the wire assembly is a multi-core wire assembly.

4. The electromagnetic shield termination assembly according to claim 1, wherein an electrically conductive ground strap attached to the housing and to an electrical ground.

5. The electromagnetic shield termination assembly according to claim 1, wherein a passage is formed in the housing through which the wire assembly extends, and a first electrically conductive member is mounted between the electromagnetic shield and a surface of the passage in the housing that defines a portion of the flow path for the electrical current flowing in the electromagnetic shield.

6. The electromagnetic shield termination assembly according to claim 5, wherein a second electrically conductive member is mounted between the first electrically conductive member and the surface of the passage in the housing that defines a portion of the flow path for the electrical current flowing in the electromagnetic shield.

7. The electromagnetic shield termination assembly according to claim 6, wherein the first electrically conductive member is a substantially cylindrical first ferrule circumferentially mounted about a first portion of the electromagnetic shield, and wherein a second portion of the electromagnetic shield is formed circumferentially about the first ferrule such that the second portion of the electromagnetic shield engages an outer surface of the first ferrule.

8. The electromagnetic shield termination assembly according to claim 7, wherein the second electrically conductive member is a substantially cylindrical second ferrule circumferentially mounted about the first ferrule and the second portion of the electromagnetic shield such that the second ferrule engages the second portion of the electromagnetic shield.

9. The electromagnetic shield termination assembly according to claim 8, wherein the second ferrule has a cylindrical body having a first end, a second end, an axially extending passage therethrough, and a plurality of engaging arms extending axially and radially outwardly of the second end, the engaging arms engaging the surface of the passage in the housing.

10. The electromagnetic shield termination assembly according to claim 1, further comprising:
a first resilient wire seal mounted about the shielded portion of the wire assembly within the passage in the housing;
a second resilient wire seal mounted about the non-shielded portion of the wire assembly within the passage in the housing;
a first seal retainer having a wire aperture through which the shielded portion of the wire assembly extends, the first seal retainer mounted to a first end of the housing; and
a second seal retainer having a wire aperture through which the non-shielded portion of the wire assembly extends, the second seal retainer mounted to a second end of the housing.

11. The electromagnetic shield termination assembly according to claim 10, wherein the first seal retainer is formed from electrically conductive material and defines a portion of the flow path for the electrical current flowing in the electromagnetic shield.

12. The electromagnetic shield termination assembly according to claim 11, wherein an electrically conductive ground strap attached to the first seal retainer and to an electrical ground.

13. A termination device configured to terminate electrical current flowing in an electromagnetic shield on a shielded electrically conductive wire, the termination device comprising:
an electrically conductive substantially cylindrical housing having a first end portion, a second end portion, a central portion between the first and second end portions, and an axially extending passage, a surface of the axially extending passage configured to engage an electromagnetic shield on a shielded electrically conductive wire;
a substantially cylindrical, electrically conductive first ferrule configured for mounting between the electromagnetic shield on the shielded electrically conductive wire and a surface of the axially extending passage in the housing, the first ferrule defining a portion of a flow path for an electrical current flowing in the electromagnetic shield; and
a substantially cylindrical, electrically conductive second ferrule circumferentially mounted about the first ferrule and configured to receive a portion of the electromagnetic shield between the first and second ferrules, the second ferrule also engaging the surface of the axially extending passage in the housing, the second ferrule defining a portion of the flow path for a electrical current flowing in the electromagnetic shield.

14. The termination device according to claim 13, further comprising:
a first seal retainer having a wire aperture formed therethrough, the first seal retainer mounted to and closing the first end portion of the housing; and
a second seal retainer having a wire aperture formed therethrough, the second seal retainer mounted to and closing the second end portion of the housing.

15. The termination device according to claim 14, further comprising
a first resilient wire seal having a wire passage formed therethrough, and mounted in the first end portion of the housing; and
a second resilient wire seal having a wire passage formed therethrough, and mounted in the second end portion of the housing.

16. The termination device according to claim 13, wherein the second ferrule has a cylindrical body having a first end, a second end, an axially extending passage therethrough, and a plurality of engaging arms extending axially and radially outwardly of the second end, the engaging arms engaging the surface of the axially extending passage in the housing.

17. An electromagnetic shield termination assembly comprising:
a wire assembly having an electrically conductive wire and an electromagnetic shield covering portion of the electrically conductive wire and thereby defining a shielded portion of the wire assembly, a non-shielded portion of the wire assembly extending outwardly of a terminal end of the electromagnetic shield; and a termination device comprising:
- an electrically conductive housing having a passage formed therein through which the wire assembly extends;
- a substantially cylindrical first ferrule circumferentially mounted about a first portion of the electromagnetic shield of the wire assembly, wherein a second portion of the electromagnetic shield is formed circumferentially about the first ferrule such that the second portion of the electromagnetic shield engages an outer surface of the first ferrule; and
- a substantially cylindrical second ferrule circumferentially mounted about the first ferrule and the second portion of the electromagnetic shield such that the second ferrule engages the second portion of the electromagnetic shield, wherein the second ferrule has a cylindrical body having a first end, a second end, an axially extending passage therethrough, and a plurality of engaging arms extending axially and radially outwardly of the second end, the engaging arms engaging the surface of the passage in the housing;
- wherein the housing is mounted to the wire assembly about the first and second ferrules, such that the shielded portion of the wire assembly extends outwardly of a first end of the housing and the non-shielded portion of the wire assembly extends outwardly of a second end of the housing, the first and second ferrules and the housing providing a flow path for an electrical current flowing in the electromagnetic shield.

18. The electromagnetic shield termination assembly according to claim 17, further comprising:
- a first resilient wire seal mounted about the shielded portion of the wire assembly within the passage in the housing;
- a second resilient wire seal mounted about the non-shielded portion of the wire assembly within the passage in the housing;
- a first seal retainer having a wire aperture through which the shielded portion of the wire assembly extends, the first seal retainer mounted to a first end of the housing; and
- a second seal retainer having a wire aperture through which the non-shielded portion of the wire assembly extends, the second seal retainer mounted to a second end of the housing.

\* \* \* \* \*